(12) United States Patent
Zheng

(10) Patent No.: US 7,255,494 B2
(45) Date of Patent: Aug. 14, 2007

(54) LOW-PROFILE PACKAGE FOR HOUSING AN OPTOELECTRONIC ASSEMBLY

(75) Inventor: Tieyu Zheng, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 317 days.

(21) Appl. No.: 10/706,209

(22) Filed: Nov. 12, 2003

(65) Prior Publication Data

US 2004/0234214 A1   Nov. 25, 2004

Related U.S. Application Data

(63) Continuation-in-part of application No. 10/444,342, filed on May 23, 2003, now Pat. No. 6,860,652.

(51) Int. Cl.
G02B 6/36 (2006.01)
H01L 21/00 (2006.01)

(52) U.S. Cl. ............... 385/92; 385/94; 438/121; 438/125

(58) Field of Classification Search ........... 385/88–94, 385/147, 14; 29/830; 257/629, 704; 438/26, 438/221, 121, 106, 112, 116, 118, 119, 122–128, 438/12; 372/36, 43
See application file for complete search history.

(56) References Cited

U.S. PATENT DOCUMENTS

| | | |
|---|---|---|
| RE29,325 E | 7/1977 | Hargis |
| 4,712,030 A | 12/1987 | Lakin et al. |
| 4,780,795 A | 10/1988 | Meinel |
| 4,953,006 A | 8/1990 | Kovats |
| 5,227,646 A | 7/1993 | Shigeno |
| 5,337,396 A | 8/1994 | Chen et al. |
| 5,378,924 A | 1/1995 | Liang |
| 5,537,504 A | 7/1996 | Cina et al. |
| 5,736,783 A | 4/1998 | Wein et al. |
| 6,156,992 A | 12/2000 | Besslein |
| 6,166,461 A | 12/2000 | Kusase et al. |
| 6,172,412 B1 | 1/2001 | Wein et al. |
| 6,186,674 B1 | 2/2001 | Basavanhally |
| 6,203,212 B1 | 3/2001 | Rosenberg et al. |
| 6,227,724 B1 | 5/2001 | Verdiell |

(Continued)

OTHER PUBLICATIONS

Z.F. Shi et al., "Heat Sink Design Optimization for Optical Transponders," The 35th International Symposium on Microelectronics, Denver, Colorado, Sep. 4-6, 2002, available at http://www.flotherm.com/technical_papers/t315.pdf.

(Continued)

Primary Examiner—Hemang Sanghavi
(74) Attorney, Agent, or Firm—Marshall, Gerstein & Borun LLP

(57) ABSTRACT

A low-profile package for housing an optoelectric device is disclosed. The low-profile package includes an insulating base having an upper surface. The optoelectric device is mounted to the upper surface of the insulating base. The low-profile package also includes a metal sealing member having a top wall and a bottom wall. The bottom wall of the metal sealing member is attached to the upper surface of the insulating base. The low-profile package further includes a substantially flat metal cover attached to the top wall of the metal sealing member to thereby hermetically seal the metal cover to the insulating base.

25 Claims, 2 Drawing Sheets

U.S. PATENT DOCUMENTS

| | | |
|---|---|---|
| 6,252,762 B1 | 6/2001 | Amatucci |
| 6,252,773 B1 | 6/2001 | Werner |
| 6,303,893 B1 | 10/2001 | Perks |
| 6,328,484 B1 | 12/2001 | Uebbing |
| 6,331,992 B1 | 12/2001 | Gilliland et al. |
| 6,349,105 B1 * | 2/2002 | Gilliland et al. ........... 372/50.1 |
| 6,354,747 B1 | 3/2002 | Irie et al. |
| 6,376,268 B1 | 4/2002 | Verdiell |
| 6,388,264 B1 | 5/2002 | Pace |
| 6,400,566 B1 | 6/2002 | Ootori |
| 6,407,357 B1 | 6/2002 | Bellino et al. |
| 6,422,766 B1 | 7/2002 | Althaus et al. |
| 6,426,591 B1 | 7/2002 | Yanagisawa et al. |
| 6,444,297 B1 | 9/2002 | Bischel |
| 6,446,873 B1 | 9/2002 | Geryk |
| 6,450,699 B1 | 9/2002 | Murali et al. |
| 6,459,842 B1 | 10/2002 | Arsenault et al. |
| 6,493,861 B1 | 12/2002 | Li et al. |
| 6,495,895 B1 | 12/2002 | Peterson et al. |
| 6,501,652 B2 | 12/2002 | Katsui |
| 6,506,998 B2 | 1/2003 | VanOtteren et al. |
| 6,511,236 B1 | 1/2003 | Webjorn et al. |
| 6,512,861 B2 | 1/2003 | Chakravorty et al. |
| 6,515,251 B1 | 2/2003 | Wind |
| 6,723,379 B2 * | 4/2004 | Stark .......................... 427/180 |
| 6,860,652 B2 * | 3/2005 | Narayan et al. ............... 385/94 |
| 2002/0043551 A1 | 4/2002 | Payer et al. |
| 2003/0223709 A1 | 12/2003 | Lake et al. |
| 2003/0231671 A1 * | 12/2003 | Huang et al. .................. 372/36 |
| 2004/0010910 A1 | 1/2004 | Farrell et al. |
| 2004/0012083 A1 | 1/2004 | Farrell et al. |
| 2004/0146253 A1 * | 7/2004 | Wang et al. ................... 385/93 |
| 2004/0150072 A1 | 8/2004 | Schnitt et al. |
| 2005/0105907 A1 * | 5/2005 | Richardson et al. .......... 398/79 |

OTHER PUBLICATIONS

Kayner, "Tolerance considerations for 10 Gbit/s pluggable module EMI solutions and electrical connector engagement," Aug. 1, 2002, available at http://www.xpak.org/XPAK%20whitepaper%20-%20Bezel%20EMI%considerations.pdf.

Kayner et al., "Designing a 10 Gbit/s small form factor pluggable transceiver module for PCI applications," Aug. 8, 2002, available at http://www.xpak.org/XPAK%20whitepaper%20-%20Designing%20for%PCI%.

Selected pages of Kyocera online catalog, available at http://www.kyocera.co.jp/frame/product/semicon/oe_pkg/btf_pkg.html on Nov 6, 2001.

Tatum, "VCSEL Packaging for Data Communication Transceiver Design", Fiberoptic Product News, pp. 21-23, Jun. 2000.

* cited by examiner

LOW-PROFILE PACKAGE FOR HOUSING AN OPTOELECTRONIC ASSEMBLY

CROSS REFERENCE TO RELATED APPLICATION

This application is a continuation-in-part (CIP) of application Ser. No. 10/444,342, entitled "Package for Housing an Optoelectric Assembly" filed May 23, 2003 now U.S. Pat. No. 6,860,652.

FIELD OF THE DISCLOSURE

An optoelectric assembly and, more specifically, a low-profile package for housing an optoelectric assembly are disclosed.

BACKGROUND

Optoelectric components or active optical devices such as diode lasers, light-emitting diodes (LEDs), and photodiode detectors are used for printing, data storage, optical data transmission and reception, laser pumps, and a multitude of other applications. Most optoelectric components are typically sealed inside a hermetically sealed package for performance requirements and operational stability. Optoelectric packages are intended to provide a hermetic structure to protect passive and active optical elements and devices as well as related electrical components from damage resulting from moisture, dirt, heat, radiation, and/or other sources.

For high-speed applications (e.g., 2 Gbps and above), proper operation of the optical and/or electrical components inside the package may be affected unless careful attention is paid to the packaging of these components. Standard optical module packaging such as that used in optical telecommunication applications requires a hermetic enclosure. Sealed packages are necessary to contain, protect, and electrically connect optoelectric components. These requirements have resulted in packages that are large, costly, and more difficult to manufacture than typical electronic packages. In fact, the cost and size of most optoelectric devices are mainly dominated by the package rather than the optical devices themselves.

Current designs of optoelectric packages and associated fabrication processes are not easily adapted for automated manufacturing techniques because conventional packages for optoelectric components such as large so-called "butterfly" packages are characterized by numerous mechanical parts (submounts, brackets, ferrules, etc.), and three-dimensional (3D) alignment requirements. Butterfly packages are basically can-and-cover type arrangements that contain an optical subassembly mounted to a metallic baseplate, with leads coming out of the sides for electrical connections. The optical subassembly may be built up separately, outside of the can, and then later installed in the can. The circuits within the optical subassembly are wire-bonded to the leads of the butterfly can, which is then sealed with a lid to create a hermetic enclosure. Unfortunately, conventional butterfly cans have a high profile, and are costly and time-consuming to manufacture. In addition, the electrical components require a separate electrical subassembly that is located outside of the butterfly can. The requirement of a separate electrical subassembly that is separate and apart from the optical subassembly inside the butterfly can increases manufacturing costs significantly.

Transistor-Outline (TO) packages are also commonly used to house optoelectric components. Conventional TO packages include a generally tall, cylindrical, u-shaped metal cap, and a metal header or base to which the metal cap is attached. In such packages, metal-based bonding techniques such as, for example, fusion welding, are often required to provide a hermetic seal between the metal cap and the header. To weld the metal cap onto the header, the header is typically formed of a metallic material such as Kovar™ or stainless steel. However, it is advantageous to use ceramic bases in connection with high-speed applications because ceramic bases are ideal for RF applications. Particularly, ceramic headers provide easy routing of high-speed circuits. Unfortunately, ceramic is not compatible with metal with regard to weldability, and therefore has not been widely used as the material for the header or base in conventional TO packages. In addition, because of the u-shaped configuration of the metal caps associated with conventional TO packages, expensive tooling such as, for example, two-piece tooling equipment, is required to manufacture the unshaped metal caps.

Typically, when active optical devices (e.g., diode lasers) and integrated circuits adapted to control the active optical devices (e.g., diode drivers) are spaced too far apart from each other, parasitic capacitance, resistance, and/or inductance may affect electrical signals traveling-between the components, thus resulting in slower signal propagation speeds. The electrical performance is of particular concern for high-speed applications. Consequently, electrical performance may be improved during high-speed applications when the distance between the active optical device and its associated driving or receiving integrated circuit chip is as short as possible. Although this arrangement may increase signal propagation speed, it may, unfortunately, also increase heat dissipation requirements of the assembly significantly.

As the power density increases in optoelectric devices and/or electrical components used in high-speed applications, an optimal heat sink is necessary to dissipate heat efficiently from the optoelectric device and/or electrical components. Heat sinks are devices capable of dissipating heat away from the optoelectric and/or electrical components into the surrounding atmosphere by convection. Typical heat sinks may include cooling fins attached to a heat sink base that is in contact with the header or base of the optoelectric package. The fins of the heat sink may have any shape and size necessary to dissipate heat away from the optoelectric device and/or electrical components, and may be oriented either parallel or perpendicular relative to the base of the optoelectric package.

Commercially available heat sinks are generally square or rectangular in shape. As such, the circular headers of conventional optoelectric packages require either modifications to the structural design of the heat sinks to be able to accommodate the circular headers, or manufacturing adjustments to attach the circular header to the square or rectangular heat sink. This configuration results in a complex, slow, and expensive manufacturing process. Additionally, the quality of the contact between the optoelectric package and the attached heat sink has a great impact on the overall thermal performance. Lower thermal impedance between the optoelectric package and the heat sink results in higher conductive heat transfer. Therefore, it is advantageous that the header of the optoelectric package be in intimate, conformal contact with the attached heat sink to optimize the thermal characteristics, which results in increased efficiency.

In addition, existing optoelectric packaging techniques often involve manual or semi-automated manufacturing processes. Therefore, to reduce manufacturing costs, it is advantageous to employ automated batch packaging processes that can fabricate a large number of optoelectric packages simultaneously.

Currently, there is a great demand for smaller optoelectric packages to allow for higher density of data transmission. Smaller optoelectric packages allow the devices (e.g., transceivers) into which the optoelectric packages are placed to become smaller. Moreover, optoelectric packages having a lower profile are advantageous due to space limitations of the devices into which the optoelectric packages are placed. Therefore, a need exists for an optoelectric package that provides for a more efficient use of limited space, allows for automated fabrication, and that is simple and inexpensive to fabricate.

DESCRIPTION OF THE PRESENTLY PREFERRED EMBODIMENTS

Figure 1:
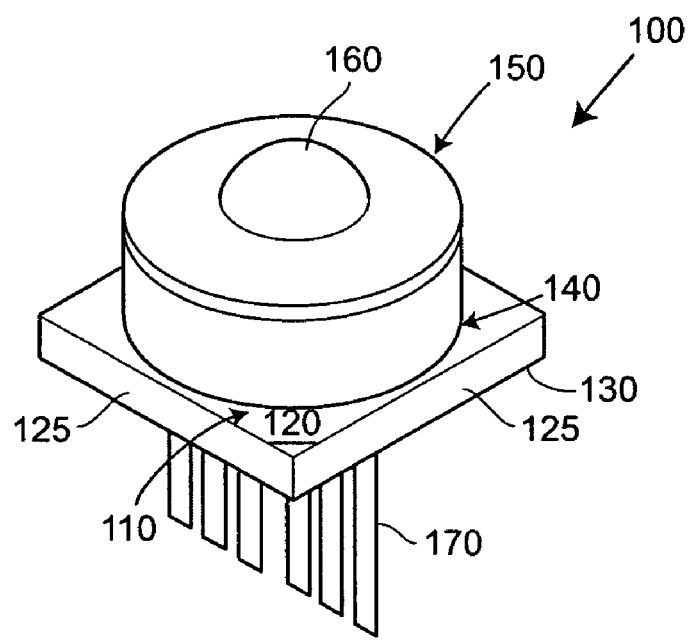
FIG. 1 is a perspective view of a low-profile package for housing an optoelectric assembly.

Referring to FIG. 1, a low-profile package 100 for housing an optoelectric assembly is shown. The low-profile package 100 includes an insulating base or substrate 110, a metal sealing member 140, and a substantially flat metal cover 150. Preferably, the insulating base. 110 is formed of a material with high thermal conductivity for directing dissipated heat away from the optoelectric assembly. By using a high thermal conductivity material, the insulating base 110 is capable of effectively dissipating the heat of uncooled active optical devices, e.g., diode lasers, and can incorporate integrated circuits, e.g., diode driver chips, into the low-profile optoelectric package 100.

In the past, integrated circuit chips have not been integrated into the optoelectric package 100 because the thermal conductivity of the metallic header of conventional optoelectric packages was unsuitable for mounting such chips. As discussed in greater detail below, the integrated, low-profile optoelectric package 100 of the present disclosure, which includes the active optical device 200 and its associated integrated circuit 220 (see FIG. 4) provides a high-speed module that saves power, space, and costs, without sacrificing reliability and performance.

Suitable materials for the insulating base 110 include ceramics such as alumina, beryllium oxide (BeO), and aluminum nitride (AlN). The insulating base 110 includes an upper surface 120, a lower surface 130, and four substantially flat sidewalls 125 (only two of which are shown) extending downwardly from the upper surface 120. The thickness of the insulating base 110 may be approximately 1 mm. Of course, it should be understood that the insulating base 110 could be thicker or thinner as desired.

As shown, both the upper and lower surfaces 120, 130 of the insulating base 110 are substantially planar. It is well known that mounting techniques using planar substrates such as, for example, pick-and-place techniques, are suited to high-volume manufacturing. In addition, because overall mechanical stability is directly related to the stability of the base 110, the substantially planar upper surface 120 of the low-profile optoelectric package 100 provides good mechanical stability. Furthermore, by using a base 110 made of a material with a coefficient of thermal expansion (CTE) that matches the CTE of the metal sealing member 140 (e.g., a base 110 made of a ceramic with a low CTE), optimal mechanical stability may be obtained.

Due to the polygonal shape (e.g., square or rectangular) of the insulating base 110, the contact at the mating, heat-conducting surface of the insulating base 110 and a commercially available square or rectangular-shaped heat dissipating device (not shown) may be improved. Preferably, the heat dissipating device is a heat sink. However, other types of heat dissipating devices such as, for example, heat pipes are equally applicable. In this manner, the polygonal shape of the insulating base 110 provides sufficient thermal contact and coupling with a polygonal-shaped (e.g., square or rectangular) heat sink, thereby improving the heat transfer characteristics therebetween. In addition, the substantially flat sidewalls 125 provide a heat dissipation area because the heat generated by the optoelectric and/or electrical components housed within the low-profile package 100 may be conducted to the substantially flat sidewalls 125. As a result, heat dissipation efficiency is increased. Furthermore, the high thermal conductivity of the ceramic material of the insulating base 110 makes it possible to efficiently extract the heat produced by the optoelectric device and/or electrical components.

Figure 2:
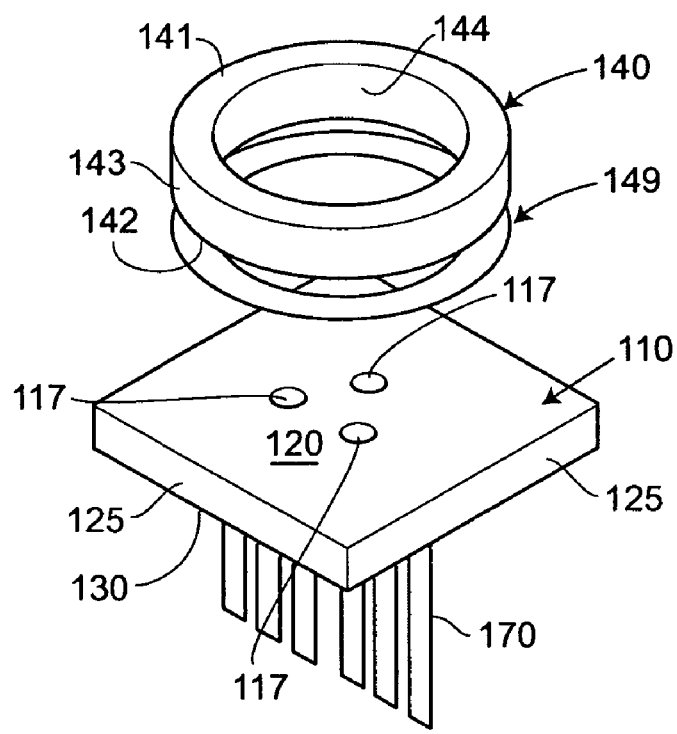
FIG. 2 is an exploded view of an insulating base, an adhesive layer, and a metal sealing member in accordance with a first embodiment.

With reference to FIG. 2, a first plurality of holes or signal vias 117 may be formed through the insulating base 110 by, for example, a mechanical drilling process or a laser machining process. The first plurality of holes 117 is adapted to electrically connect signals from the upper surface 120 of the insulating base 110 to the lower surface 130 of the insulating base 110.

Figure 3:
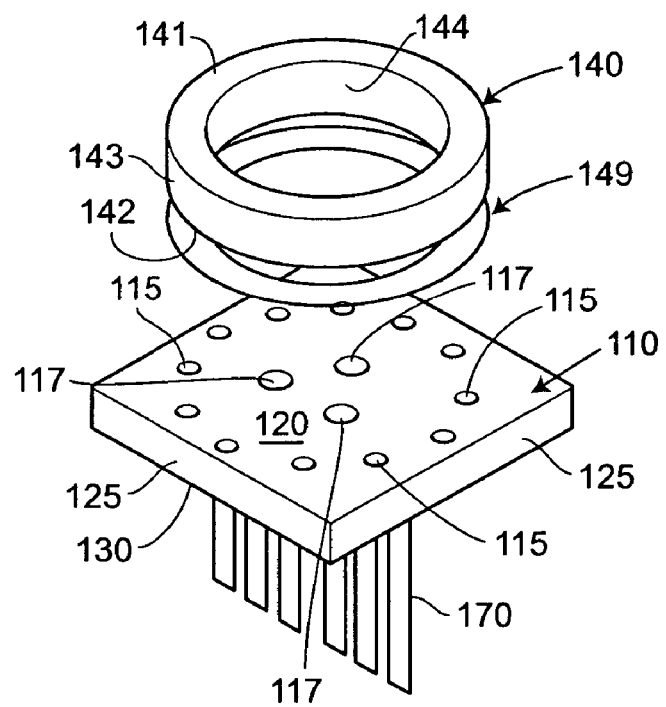
FIG. 3 is an exploded view of the insulating base, the adhesive layer, and the metal sealing member in accordance with a second embodiment.

In a second embodiment illustrated in FIG. 3, a second plurality of holes or vias 115 may be formed through the insulating base 110. The second plurality of holes 115 is adapted to conduct welding current from the substantially flat metal cover 150 to the insulating base 110 when the substantially flat metal cover 150 is hermetically sealed to the insulating base 110 by, for example, a resistance welding technique.

The insulating base 110 also includes a conductive material layer (not shown) deposited on both the upper and lower surfaces 120, 130 of the insulating base 110. The material layers may be deposited using physical vapor deposition (PVD) techniques such as evaporation, sputtering, screen printing, or other suitable processes. The conductive material may include a metal such as, for example, copper, gold, tin, a copper/tin alloy, tungsten, lead, nickel, palladium, or any other similar metal. Preferably, the metal layers on each of the upper and lower surfaces 120, 130 of the insulating base 110 include a thick film metallization that is capable of being soldered or brazed. In other words, the metal layers include films with a thickness of greater than approximately 10 μm. If desired, however, the metal layers may include a thin film metallization. In any event, the thickness of the metal layers is based, in part, on the requirements for brazing or soldering of the metal sealing member 140 to the upper surface 120 of the insulating base 110.

The first plurality of holes 117 is, likewise, substantially filled with the same or similar electrically conductive material as that deposited on the upper and lower surfaces 120, 130 of the insulating base 110. For example, the first plurality of holes 117 may be filled with flowable solder, or screen-filled using a paste of conductive material such as, for example, copper and/or tungsten.

Similarly, in the second embodiment illustrated in FIG. 3, the first plurality of holes 117 and the second plurality of holes 115 are substantially filled with the same or similar electrically conductive material as that deposited on the upper and lower surfaces 120, 130 of the insulating base 110. In the embodiment of FIG. 3, a metal contact member (not shown) may be attached to the lower metallized surface 130 of the insulating base 110 via an adhesive layer (e.g., a brazing paste or a solder preform layer) disposed between the metal contact member and the lower surface 130 of the insulating base 110. In this manner, the metal contact member is in contact with each of the second plurality of filled holes 115 at the lower surface 130 of the insulating base 110. The metal contact member may be sufficiently etched, grinded, and/or polished to provide a substantially flat contact surface at the lower surface 130 of the insulating base 110.

The insulating base 110 may be configured as a multilayer substrate having a plurality of levels. Multiple metal layers may be provided at each of the plurality of levels, and joined together (e.g., laminated) on the insulating base 110. In this configuration, the first plurality of holes 117 may be formed in the layers so that signals can be communicated between the adjacent layers.

The metal layers deposited on the upper and lower surfaces 120, 130 of the insulating base 110 may be patterned to include a plurality of electrically conductive paths or traces (not shown). The metallized pattern on the upper and lower surfaces 120, 130 of the insulating base 110 may be formed by photolithography, electroplating, etching, screen printing, or other similar techniques. The optical devices and/or electrical components may be mounted to and electrically connected to the conductive metallized pattern on the upper surface 120 of the insulating base 110.

At least one electrical lead 170 is attached, e.g., by brazing, to the lower metallized surface 130 of the insulating base 110, and is connected to the upper metallized surface 120 of the insulating base 110 via the first plurality of filled holes 117. The electrical leads 170 are adapted to communicate signals from the optoelectric and/or electrical components housed inside the low-profile package 100 to components located external to the package 100 on, for example, a printed circuit board. The leads 170 may be circular or rectangular in cross-section. Preferably, the electrical leads 170 are arranged as an array of leads 170, and may be located at any location on the lower surface 130 of the insulating base 110. The insulating base 110 may be operatively coupled to sockets in the printed circuit board (not shown) via the electrical leads 170. Alternatively, the insulating base 110 may be operatively coupled to the printed circuit board using solder connections such as, for example, ball grid array connections and/or a flex circuit.

The metal sealing member 140 may be sealably attached to the upper metallized surface 120 of the insulating base 110 using an adhesive layer 149 disposed between the metal sealing member 140 and the upper surface 120 of the insulating base 110. The metal layer on the upper surface 120 of the insulating base 110 may be etched, grinded, and/or polished to provide a substantially flat contact surface for attachment of the metal sealing member 140. The metal sealing member 140, which may be formed of Kovar™ or any other similar metallic material, includes a top wall 141, a bottom wall 142, an outer wall 143, and an inner wall 144.

Preferably, the metal sealing member 140 is a sealing ring having a generally circular cross-sectional shape between the outer wall 143 and inner wall 144. However, the metal sealing member 140 may have other shapes as well. For example, the metal sealing member 140 may have a generally oval cross-sectional shape between the outer wall 143 and inner wall 144. Still further, the metal sealing member 140 may have a polygonal shape such as a rectangular cross-sectional shape or a square cross-sectional shape between the outer wall 143 and inner wall 144. Lastly, the thickness of the metal sealing member 140 may range from approximately 0.5 mm to approximately 2 mm. In this manner, the relatively thick outer wall 143 of the metal sealing member 140 encircles and protects the optoelectric and/or electrical components located within an inner region of the metal sealing member 140.

The adhesive layer 149, which is basically a wafer-sized prefabricated bond, is disposed on the upper surface 120 of the insulating base 110. The adhesive layer 149 may include a brazing paste of, e.g., copper and/or silver, or a solder preform layer 149 formed of metal (e.g., a gold or tin preform). The bottom wall 142 of the metal sealing member 140 is then positioned on the adhesive layer 149 on the upper surface 120 of the insulating base 110. Through appropriate use of a brazing heat operation, the metal sealing member 140 is bonded to the upper surface 120 of the insulating base 110.

Referring back to FIG. 1, the substantially flat cover 150, which is preferably formed of Kovar™ or other suitable metal, is then hermetically sealed to the top wall 141 of the metal sealing member 140 to contain and fully enclose the optoelectric and electrical components mounted to the upper surface 120 of the insulating base 110, and to thereby seal off the module package 100. Use of such a hermetically sealed cover 150 acts to keep out moisture, corrosion, and ambient air to therefore protect the generally delicate optoelectric and electrical components housed inside the low-profile package 100.

Typically, the metal cover 150 is circular or cylindrical in shape. However, the metal cover 150 may have a square or rectangular shape instead depending on the shape of the metal sealing member 140. In other words, the shape of the metal cover 150 is generally complementary to the shape of the metal sealing member 140 so that the metal cover 150 can be hermetically sealed to the top wall 141 of the metal sealing member 140. For example, the metal cover 150 may be generally circular when the metal sealing member 140 has a generally circular cross-sectional shape between the outer wall 143 and inner wall 144. Likewise, the metal cover 150 may be generally rectangular when the metal sealing member 140 has a generally rectangular cross-sectional shape between the outer wall 143 and inner wall 144. By enclosing and hermetically sealing the metal cover 150 to the insulating base 110, the optoelectric and electrical components housed within the package 100 are kept in a controlled gaseous, liquid, or vacuum environment that protects them and prevents degradation in their performance and/or lifetime. In addition, the metal cover 150 is substantially flat to minimize the height or profile of the package 100, and thereby provide a higher density.

As shown in FIG. 1, the substantially flat metal cover 150 may be set back from the outer wall 143 of the metal sealing member 140. Alternatively, the substantially flat metal cover s may be substantially flush with the outer wall 143 of the metal sealing member 140. A hermetically sealed attachment of the substantially flat metal cover 150 to the metal sealing member 140 on the insulating base 110 may be established by, for example, seam welding, laser welding, resistance welding, soldering, glazing, etc.

Figure 4:
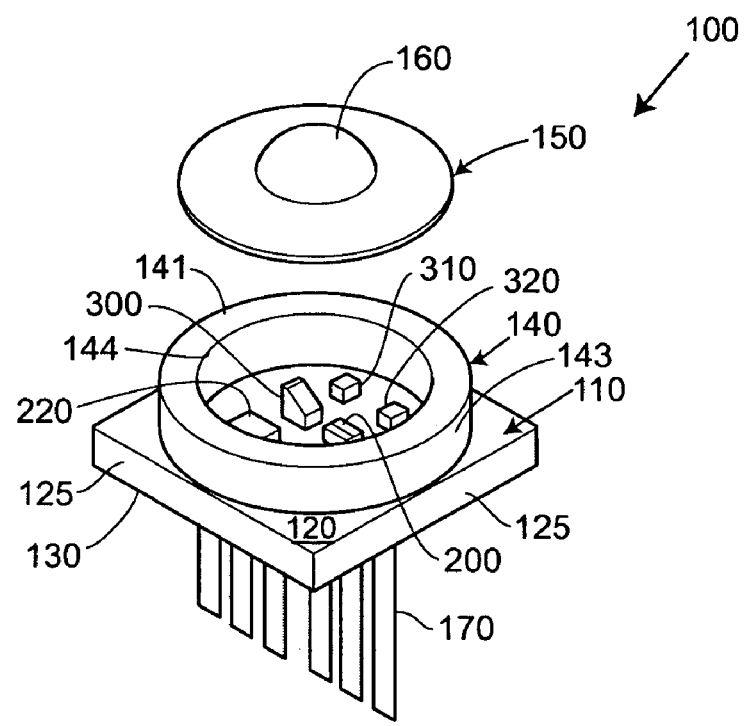
FIG. 4 is an exploded view illustrating the internal components housed inside the low-profile package.

Referring to FIG. 4, the substantially flat metal cover 150 includes a transparent portion 160 such as, for example, a flat glass window, ball lens, aspherical lens, or GRIN lens. The optoelectric components are mounted to the insulating base 110 within the low-profile package 100 in a manner such that light is able to pass to or from them through the transparent portion 160. Typically, the transparent portion 160 is formed of glass, ceramic, or plastic. To avoid effects on the optoelectric and/or electrical components housed within the low-profile package 100, the transparent portion 160 of the substantially flat cover 150 may be provided with an antireflection coating to reduce optical loss and back-reflection. The transparent portion 160 of the substantially flat metal cover 150 is aligned with the beam emergence side of the optoelectric device 200, so that the optoelectric device 200 can be optically coupled to external components such as, for example, an optical fiber or any element that requires optical alignment with other optical devices, through the transparent portion 160.

The insulating base 110 may form the bottom of the low-profile package 100, thus making a completely self-contained package 100. Alternatively, the insulating base 110 may include one or more submounts that carry the optoelectric and/or electrical components. In other words, the optoelectric and/or electrical components may be mounted directly to the upper surface 120 of the insulating base 110, or may be mounted to submounts that are attached to the insulating base 110.

As illustrated in FIG. 4, an active optical device 200 and its associated integrated circuit chip 220, a passive optical device 300, and various other electrical components 310, 320 are located within an inner region of the metal sealing member 140. As is well known, these optical and/or electrical components may be mounted to the upper surface 120 of the insulating base 110 by pick-and-place techniques commonly used in the electronics industry, and attached to the insulating base 110 by adhesive bonding, soldering, welding, gluing, or other similar method. Because the insulating base 110 is substantially planar, the pick-and-place automation may use relatively simple machine vision for accurate placement and alignment of the various components.

In the embodiment illustrated in FIG. 4, the insulating base 110 serves as both a mounting surface for the various optical and/or electrical components as well as the bottom or header of the low-profile package 100 itself. As a result, a smaller, higher-performance, and cost-effective enclosure may be realized. In particular, the low-profile package 100 may be assembled in a relatively uncomplicated manner by simply attaching the substantially flat metal cover 150 to the base 110 upon which the optoelectric components are mounted to thereby create a hermetic enclosure. In addition, due to the substantial flatness of the metal cover 150, standard tooling may be used to manufacture the substantially flat metal cover 150, thus resulting in a manufacturing process that is less complex and inexpensive.

To ensure low parasitic effects (e.g., capacitance, resistance, and/or inductance) and reduced interconnect lengths for enhanced electrical performance, it is advantageous to mount the active optical device 200 and the integrated circuit 220 close to each other inside the low-profile package 100. As a result, higher electrical performance may be achieved in smaller packages at low cost. This configuration is particularly advantageous for high-speed applications, e.g., 10 Gbps and greater, because extraneous wiring that may limit the high-speed operation of the optoelectric package 100 is eliminated.

Optically active devices 200 include any well known or future devices that generate light when stimulated, that sense light, convert light to electrical signals, or that condition light. For example, active optical devices 200 may include light emitters (e.g., vertical cavity surface-emitting lasers (VCSEL), Fabry-Perot (F-P) lasers, distributed-feedback (DFB) lasers, light emitting or sensing diodes, and the like), light sensors (e.g., photodetectors), and optical modulators. The integrated circuit 220 is any chip suitable for applying an electrical signal to the active optical device 200 to activate and control the device 200 such as, for example, a microprocessor, a driver chip for a transmitter device, or a transimpedance amplifier chip for a receiver device. Implementation of the microprocessor, driver, or transimpedance amplifier integrated circuit 220 is well known, and thus will not be further described.

In addition to the active optical device 200 and its associated integrated circuit 220, other optical and/or electrical components such as a mirror 300, thermistor 310, capacitor 320, etc. may be mounted to the insulating base 110 and housed inside the low-profile package 100. It is to be understood, however, that other optical and/or electrical devices besides those mentioned above may be mounted to the insulating base 100 as well.

In sum, the low-profile optoelectric package 100 of the present disclosure may be produced in an automated batch process that is similar to the batch processes used in manufacturing integrated circuits. In addition, the low-profile package 100 may be manufactured cost-effectively because expensive tooling is eliminated. Lastly, the low-profile optoelectric package 100 offers the simultaneous advantages of high-speed electrical operation, hermeticity, effective heat sinking, and high mechanical stability.

In the foregoing description, the disclosed structures and manufacturing methods have been described with reference to exemplary embodiments. It will, however, be evident that various modifications and changes may be made thereto without departing from the broader spirit and scope of this disclosure. The above specification and figures accordingly are to be regarded as illustrative rather than restrictive. It is therefore intended that the present disclosure be unrestricted by the foregoing description and drawings, except as may appear in the following appended claims.

What is claimed is:

1. A low-profile package for housing an optoelectric device, comprising:
    an insulating base having an upper surface, wherein an optoelectric device is mounted to the upper surface of the insulating base;
    a metal member having a top wall and a bottom wall, wherein the bottom wall of the metal member is attached to the upper surface of the insulating base;
    a substantially flat metal cover attached to the top wall of the metal member to hermetically seal the metal cover to the insulating base, wherein the flat metal cover is supported above the optoelectric device by the top wall of the metal member; and
    an integrated circuit mounted adjacent to the optoelectric device on the upper surface of the insulating base, wherein the integrated circuit is electrically connected to the optoelectric device.

2. The low-profile package of claim 1, wherein the metal member has a thickness ranging from approximately 0.5 mm to approximately 2 mm.

3. The low-profile package of claim 1, further including a first metal layer disposed on the upper surface of the insulating base.

4. The low-profile package of claim 3, further including a second metal layer disposed on a lower surface of the insulating base, wherein each of the first and second metal layers includes a pattern of conductive paths.

5. The low-profile package of claim 4, further including at least one electrical lead attached to the lower metallized surface of the insulating base, wherein the at least one electrical lead is adapted to electrically communicate signals from the optoelectric device housed inside the low-profile package to components located external to the low-profile package.

6. The low-profile package of claim 4, further including an upper adhesive layer disposed on the upper surface of the insulating base, wherein the metal member is attached to the upper metallized surface of the insulating base via the upper adhesive layer.

7. The low-profile package of claim 6, wherein the upper adhesive layer includes one of a solder preform layer and a brazing material.

8. The low-profile package of claim 1, wherein the insulating base is a multilayer base comprising metal layers located at a plurality of levels of the base and electrically connected together.

9. The low-profile package of claim 1, further including a submount attached to the upper surface of the insulating base, wherein the optoelectric device is mounted to the submount.

10. The low-profile package of claim 1, further including a heat dissipating device attached to the insulating base.

11. The low-profile package of claim 1, wherein the insulating base comprises a ceramic material.

12. The low-profile package of claim 1, wherein the insulating base has a polygonal shape.

13. The low-profile package of claim 1, wherein the metal member further includes an outer wall and an inner wall that extend along a perimeter of the insulating base, wherein the optoelectric device is located within an inner region of the metal member.

14. The low-profile package of claim 13, wherein the metal member is a sealing ring extending around a circumference of the upper surface of the insulating base, wherein the sealing ring includes one of a circular cross-sectional shape between the outer wall and the inner wall or an oval cross-sectional shape between the outer wall and inner wall.

15. The low-profile package of claim 13, wherein the metal member has a polygonal shape between the outer wall and the inner wall.

16. The low-profile package of claim 1, wherein the substantially flat metal cover includes a transparent portion.

17. The low-profile package of claim 1, wherein the optoelectric device is adapted to operate at a speed of at least 10 Gbps.

18. A method for hermetically sealing a substantially flat metal cover to an insulating base, comprising:
attaching a bottom wall of a metal member to an upper surface of the insulating base;
mounting an optoelectric device to the upper surface of the insulating base, wherein the optoelectric device is located within an inner region of the metal member;
positioning the substantially flat metal cover over the optoelectric device;
attaching the substantially flat metal cover to a top wall of the metal member to hermetically enclose the optoelectric device, wherein the flat metal cover is supported above the optoelectric device by the top wall of the metal; and
mounting an integrated circuit adjacent to the optoelectric device on the upper surface of the insulating base, wherein the integrated circuit is electrically connected to the optoelectric device, and wherein both the optoelectric device and the integrated circuit are located within the inner region of the metal member.

19. The method of claim 18, further including forming a first metal layer on the upper surface of the insulating base, wherein the bottom wall of the metal member is attached to the upper metallized surface of the insulating base.

20. The method of claim 19, further including attaching the metal member to the insulating base using an upper adhesive layer located between the bottom wall of the metal member and the upper metallized surface of the insulating base.

21. The method of claim 19, further including:
forming a second metal layer on a lower surface of the insulating base; and
patterning both the first and second metal layers to include a plurality of conductive paths.

22. The method of claim 21, further including:
attaching at least one electrical lead to the lower metallized surface of the insulating base; and
electrically communicating signals from the optoelectric device to components located outside of the substantially flat metal cover via the at least one electrical lead.

23. A packaged optical module, comprising:
a base formed of an electrically insulating material and having at least a first surface and a second surface, wherein an optical device is mounted to the first surface of the base;
a sealing member formed of an electrically conducting material and attached to the first surface of the base, wherein the sealing member extends along a perimeter of the base with the optical device being located within an inner region of the sealing member;
a heat dissipating device attached to the second surface of the base;
a substantially flat cover formed of the electrically conducting material, wherein the substantially flat cover is attached to the sealing member on the base to provide a hermetic enclosure for the optical device, wherein the flat metal cover is supported above the optical device by the sealing member; and
an electronic circuit mounted to the first surface of the base and electrically connected to the optical device, wherein the electronic circuit is located within the inner region of the sealing member.

24. The packaged optical module of claim 23, further including at least one other component mounted to the first surface of the base, wherein the substantially flat cover provides a hermetic enclosure for the optical device, the electronic circuit, and the at least one other component.

25. The packaged optical module of claim 23, wherein the sealing member has a thickness ranging from approximately 0.5 mm to approximately 2 mm.

* * * * *

UNITED STATES PATENT AND TRADEMARK OFFICE
CERTIFICATE OF CORRECTION

| | | |
|---|---|---|
| PATENT NO. | : 7,255,494 B2 | |
| APPLICATION NO. | : 10/706209 | |
| DATED | : August 14, 2007 | |
| INVENTOR(S) | : Tieyu Zheng | |

It is certified that error appears in the above-identified patent and that said Letters Patent is hereby corrected as shown below:

On the Title Page:

item (*), please add -- This patent is subject to a terminal disclaimer. --.

At Column 8, line 45, "optoelectric" should be -- optoelectronic --.

At Column 8, line 48, "optoelectric" should be -- optoelectronic--

At Column 8, line 56, "optoelectric" should be -- optoelectronic --.

At Column 8, line 58, "optoelectric" should be -- optoelectronic --.

At Column 8, line 61, "optoelectric" should be -- optoelectronic --.

At Column 9, line 9, "optoelectric" should be -- optoelectronic --.

At Column 9, line 26, "optoelectric" should be -- optoelectronic --.

At Column 9, line 37, "optoelectric" should be -- optoelectronic --.

At Column 9, line 51, "optoelectric" should be -- optoelectronic --.

At Column 9, line 57, "optoelectric" should be -- optoelectronic --.

At Column 9, line 58, "optoelectric" should be --optoelectronic --.

At Column 9, line 61, "optoelectric" should be -- optoelectronic --.

At Column 9, line 63, "optoelectric" should be -- optoelectronic --.

UNITED STATES PATENT AND TRADEMARK OFFICE
CERTIFICATE OF CORRECTION

PATENT NO. : 7,255,494 B2
APPLICATION NO. : 10/706209
DATED : August 14, 2007
INVENTOR(S) : Tieyu Zheng It is certified that error appears in the above-identified patent and that said Letters Patent is hereby corrected as shown below:

At Column 10, line 2, "optoelectric" should be -- optoelectronic --.

At Column 10, line 4, "optoelectric" should be -- optoelectronic --.

At Column 10, line 7, "optoelectric" should be -- optoelectronic --.

At Column 10, lines 7-8, "optoelectric" should be -- optoelectronic --.

At Column 10, line 28, "optoelectric" should be -- optoelectronic --.

Signed and Sealed this

Fifteenth Day of April, 2008

JON W. DUDAS
*Director of the United States Patent and Trademark Office*